United States Patent
Wright

(10) Patent No.: US 8,558,497 B2
(45) Date of Patent: Oct. 15, 2013

(54) REDUCED ELECTROMAGNETIC INTERFERENCE FOR PULSE-WIDTH MODULATION

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 124 days.

(21) Appl. No.: 13/227,149

(22) Filed: Sep. 7, 2011

(65) Prior Publication Data

US 2013/0015798 A1 Jan. 17, 2013

Related U.S. Application Data

(60) Provisional application No. 61/508,235, filed on Jul. 15, 2011.

(51) Int. Cl.
*G05B 11/28* (2006.01)

(52) U.S. Cl.
USPC ............. 318/599; 318/34; 318/434; 318/696; 318/727; 318/802; 327/114; 327/131; 327/172; 327/176; 327/137; 375/130; 375/285; 375/238; 363/41

(58) Field of Classification Search
USPC ........... 318/400.25, 434, 490; 361/18, 23, 30, 361/31, 32, 41, 44, 47; 315/224, 287; 714/700; 320/166; 330/10, 251, 207; 375/130, 285, 238; 332/117; 327/114, 327/131, 157
See application file for complete search history.

(56) References Cited

U.S. PATENT DOCUMENTS

| | | | | |
|---|---|---|---|---|
| 5,488,627 A * | 1/1996 | Hardin et al. | | 375/139 |
| 6,240,123 B1 * | 5/2001 | Zhang et al. | | 375/130 |
| 7,030,594 B2 * | 4/2006 | Lee et al. | | 323/266 |
| 7,256,623 B2 * | 8/2007 | Day et al. | | 327/101 |
| 7,642,820 B2 * | 1/2010 | Chen et al. | | 327/131 |
| 7,746,130 B2 * | 6/2010 | Chang | | 327/131 |
| 8,319,466 B2 * | 11/2012 | Valdez et al. | | 318/434 |
| 2006/0064609 A1 * | 3/2006 | Bryan | | 714/700 |
| 2008/0159379 A1 * | 7/2008 | Kris | | 375/238 |
| 2008/0159382 A1 * | 7/2008 | Kris | | 375/238 |
| 2010/0090775 A1 * | 4/2010 | Huda et al. | | 332/117 |
| 2010/0109767 A1 * | 5/2010 | Midya et al. | | 330/10 |
| 2010/0259179 A1 * | 10/2010 | Bowling et al. | | 315/224 |
| 2011/0032008 A1 * | 2/2011 | Zhao et al. | | 327/114 |

OTHER PUBLICATIONS

Digital Signal Processing (Principles, Algorithms and Applications, Third Edition), John G. Proakis, Dimitris G. Manolakis, ISBN: 0133737624, TK5102.9P757 1996, pp. 236-241, © 1996.*
Digital Communication (Fundamentals and Applications, Second Edition), Bernard Sklar, ISDN: 0130847887, TK5103.7.855 2000, pp. 1014-1024, © 2001.*
Digital Signal Processing (A Practical Approach), Emmanuel C. Ifeachor, Barrie W. Jervis, ISBN: 020154413X, TK5102.133 1993, pp. 49-51, © 1993.*
Signal Processing & Linear System, B.P. Lathi, ISBN: 0941413357, TK5102.9.L38 1998, pp. 194-204. © 1998.*

* cited by examiner

*Primary Examiner* — Eduardo Colon Santana
*Assistant Examiner* — Jorge Carrasquillo

(57) ABSTRACT

A method and apparatus to drive a load using a pulse-width modulated (PWM) signal and spread a spectrum of the PWM signal across a plurality of frequencies while maintaining a constant duty cycle for the load.

23 Claims, 15 Drawing Sheets

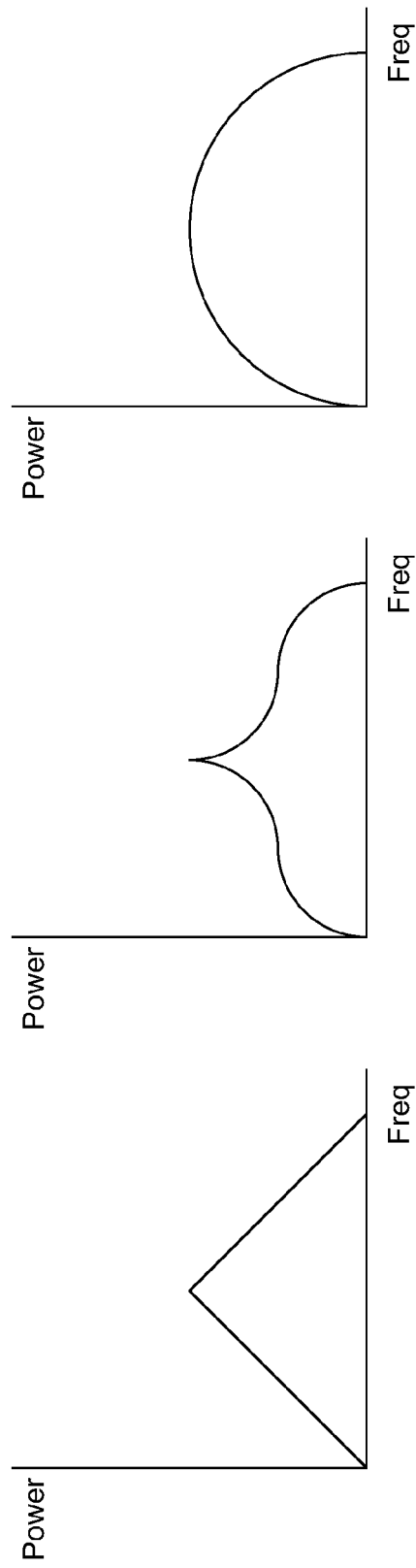

REDUCED ELECTROMAGNETIC INTERFERENCE FOR PULSE-WIDTH MODULATION

RELATED APPLICATIONS

This application claims the benefit of U.S. Provisional Application No. 61/508,235 filed on Jul. 15, 2011, which is hereby incorporated by reference herein.

TECHNICAL FIELD

This disclosure relates to the field of driving an electrical load and, in particular, to reducing electromagnetic interference when driving a load with pulse-width modulation signals.

BACKGROUND

All electrical devices require electrical energy in order to function. Many electrical devices receive electrical energy from a power supply. For example, a power supply may obtain energy from a source, such as an energy transmission system, battery, etc., and provide a voltage and current to the electrical device (which may be referred to as the load) to enable its operation.

Depending on the type of load, it may be desirable to vary the voltage and/or current provided to the load. For example, the intensity and/or color of certain types of light sources, such as a light emitting diode (LED), may be varied depending on the voltage provided by the power supply. In addition, the speed of certain types of motors may be controlled by varying the power supply applied to the motor.

In conventional systems, when only partial power is needed, the output of the power supply is reduced, for example, by a variable resistor network connected in series with the motor. This adjusts the amount of current flowing through the motor, but also wastes power as heat in the resistor elements. Furthermore, there may be inefficiencies realized in the motor itself when operating at less than full power.

Pulse-width modulation (PWM) is a technique used for controlling power to electrical devices, while maintaining a greater efficiency and/or ease of control. The average value of voltage and/or current fed to the load is controlled by turning the power supply on and off at a rapid pace. The PWM switching frequency is typically much faster than what would affect the load and can vary depending on the requirements of the load. The term "duty cycle" describes the proportion of time that the power supply is on (i.e., providing power to the load) to a regular interval or period of time. Thus, a low duty cycle corresponds to low average power, because the power is off for most of the time. The duty cycle may be expressed as a percentage, with 100% being fully on and 0% being fully off.

With PWM, the load is being powered on and off repeatedly at a certain frequency and duty cycle. This causes an emission of radiation, such as electromagnetic interference (EMI) at the switching frequency and, to a lesser extent, at its harmonics. This emission may be substantial in the case of large reactive loads (i.e., loads with a large component of inductance or capacitance, such as motors). This emission may be undesirable for a number of reasons, such as regulatory compliance issues, negative effects on the load (e.g., noise in an audio system), or other reasons.

Conventionally, the effects of emission of radiation may be reduced by using a spread spectrum clock. In spread spectrum clocking, the switching frequency is continuously or periodically varied according to a switching profile (e.g., triangle, "Hershey kiss", etc.) so that the emissions are spread across a range of frequencies. This may reduce the peak emission at any given frequency, potentially putting the system in compliance with the regulations, or reducing the negative effects of the EMI.

Spread spectrum clocking is effective in application where only the average power is important. Although the average power remains the same over a given number of cycles, the instantaneous power applied to the load may vary significantly. In certain applications, precise timing on a cycle-by-cycle basis may be important. One such application is three-phase motor control. Spread spectrum clocking typically causes the clock frequency (which controls the switching) to either constantly change or change in small discrete steps very frequently. Although the average duty cycle will remain constant, the duty cycle for each PWM period will be varying. This can have negative effects on the timing for sensitive loads.

Consider, for example, an 8-bit PWM circuit configured for a $1/256$ duty cycle. For 1 out of every 256 clock periods, the PWM output is high (i.e., the "mark" period), and for the remaining 255 clock periods (i.e., the "space" period), the PWM output is low. Thus, if the clock is spread, for example, with 5% modulation, the mark period may be up to 5% higher or lower than the average clock period. In an extreme example, the mark period may be 5% higher than average and the space period may be 5% lower than average, resulting in a duty cycle error of ~9.5%.

BRIEF DESCRIPTION OF THE DRAWINGS

The present disclosure is illustrated by way of example, and not by way of limitation, in the figures of the accompanying drawings.

FIGS. 7C-7E are diagrams illustrating frequency spreading profiles, according to an embodiment.

DETAILED DESCRIPTION

Figure 1A:
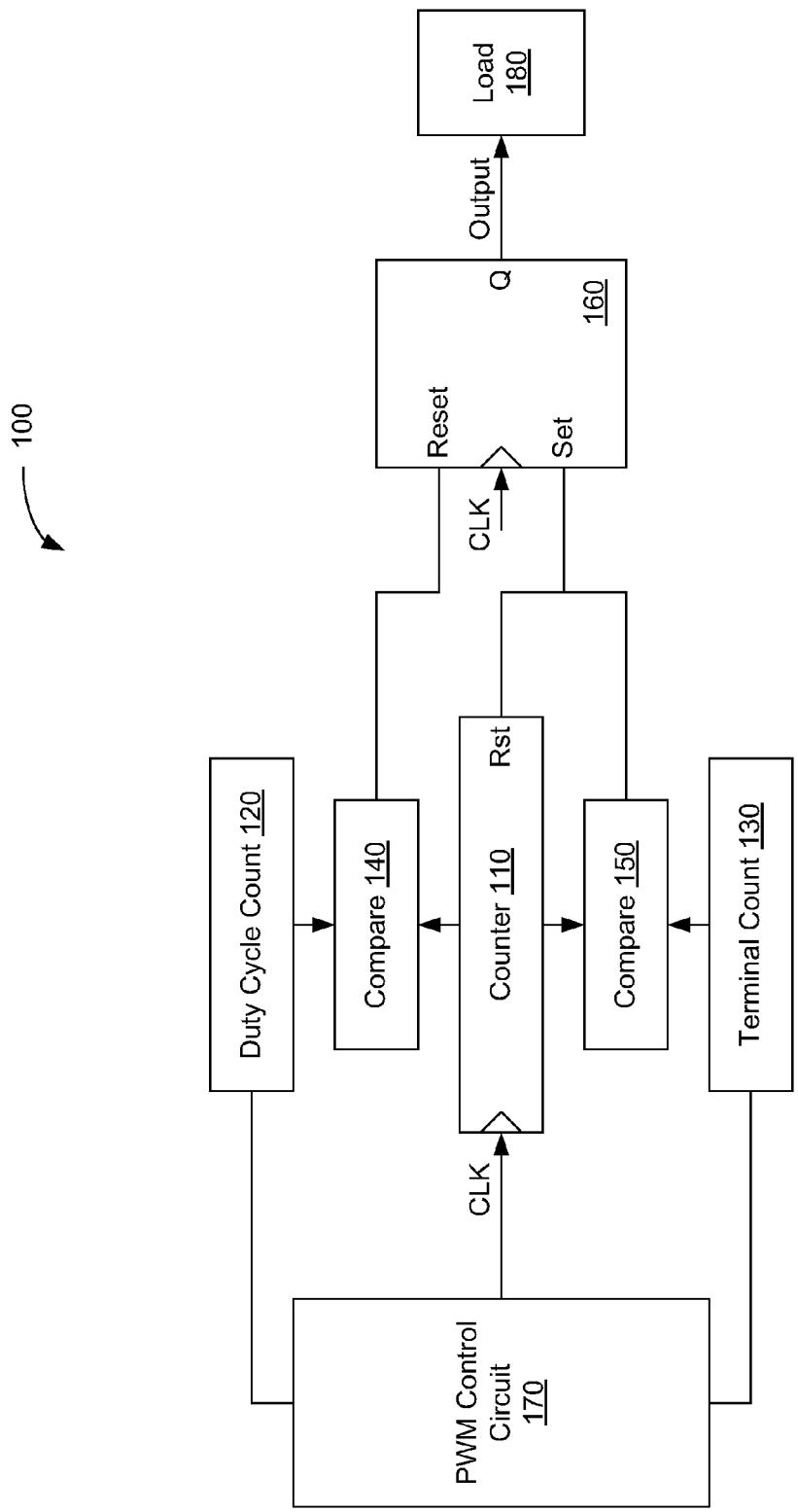
FIG. 1A is a block diagram illustrating a pulse-width modulation circuit, according to an embodiment.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described to reduce electromagnetic interference (EMI) when driving a load with pulse-width modulation (PWM) signals. This may be accomplished by spreading the spectrum of the PWM signals across a range of frequencies while maintaining a constant duty cycle for the PWM signals. The duty cycle represents a ratio of the time that the power supply is on and providing power to a load to the whole PWM period (i.e., the regular interval during which the PWM cycles from either high to low or low to high and back again). Maintaining a constant duty cycle may ensure that even loads which are extremely sensitive to changes in timing continue to operate properly.

Spreading the EMI across a range of frequencies while maintaining a constant duty cycle may be accomplished in a number of ways. In one embodiment, the frequency of a clock signal which controls the switching of a PWM circuit may be kept constant while the length of the PWM period is changed from cycle-to-cycle. A terminal count representing the PWM period length may be varied according to a predefined profile, pseudo-randomly, or otherwise at the end of each period. A duty cycle count representing either the time that the PWM is on (i.e., supplying power (the mark period)) or off (i.e., not supplying power to the load (the space period)) is proportionally varied to maintain the same duty cycle. This may be referred to as the constant clock variation. In another embodiment, the frequency of the clock signal may be varied, but the variations may be synchronized with the end of each PWM period. The length of the PWM period (i.e., the number of clock cycles) may remain the same, but since the clock frequency changes only between periods, the EMI is spread while the duty cycle remains constant from period to period. This may be referred to as the synchronized variable clock variation. In yet another embodiment, the length of the PWM period may be varied from cycle-to-cycle, while the clock frequency is also changed, but only at the start or end of each period. This allows the PWM circuit to maintain a precise duty cycle even if only a small number of frequency values are available. This approach may be referred to as the hybrid variation.

All of the approaches described herein provide the benefit of reducing EMI and improving electromagnetic compatibility (EMC) in sensitive application using PWM. These techniques may be used to avoid the duty cycle distortion which results from using a conventional spread spectrum clock with PWM.

FIG. 1A is a block diagram illustrating one of many possible implementations of a pulse-width modulation circuit, according to an embodiment of the present invention. In one embodiment, the PWM circuit 100 includes counter 110, duty cycle count value 120, terminal count value 130, digital comparators 140, 150 and flip flop 160. For ease of description, the operation of PWM circuit 100 will be described assuming that counter 110 has an initial value of zero and counts up, and that the output of PWM circuit 100 is initially high (or a "1" state) at the start of each period. One of ordinary skill in the art will recognize, however, that counter 110 may start at some other value and may count either up or down, and that the duty cycle of PWM circuit 100 may be reversed such that it switches from an initial low (or a "0") state to a high state.

In one embodiment, counter 110 starts at zero and the output of PWM circuit 100 is set to a high state. Counter 110 may count upward from the starting value at a rate controlled by a received clock signal CLK. Clock signal CLK may be provided by any known type of clocking circuit. In one embodiment, counter 110 may be a 16-bit counter, however in other embodiments, some other counter may be used. Duty cycle count 120 contains a value corresponding to the length of the "mark" period of the duty cycle. In this case, the "mark" period represents the portion of time that the output of PWM circuit 100 is high. Digital comparator 140 compares the value of duty cycle count 120 to the current value of counter 110. When digital comparator 140 determines that the value of counter 110 has reached the duty cycle count 120, the output of digital comparator 140 is set to high and applied to the "Reset" input of flip flop 160. In one embodiment, flip flop 160 is a Set-Reset (SR) flip flop, however, in other embodiments, some other flip flop, latch or circuit may be used. When the "Reset" input of flip flop 160 is high, as long as the "Set" input is low, the output Q of flip flop 160 will be changed to low (or a "0" state). This low state represents the "space" period, or the remaining portion of period when the output of PWM circuit is low.

Figure 1B:
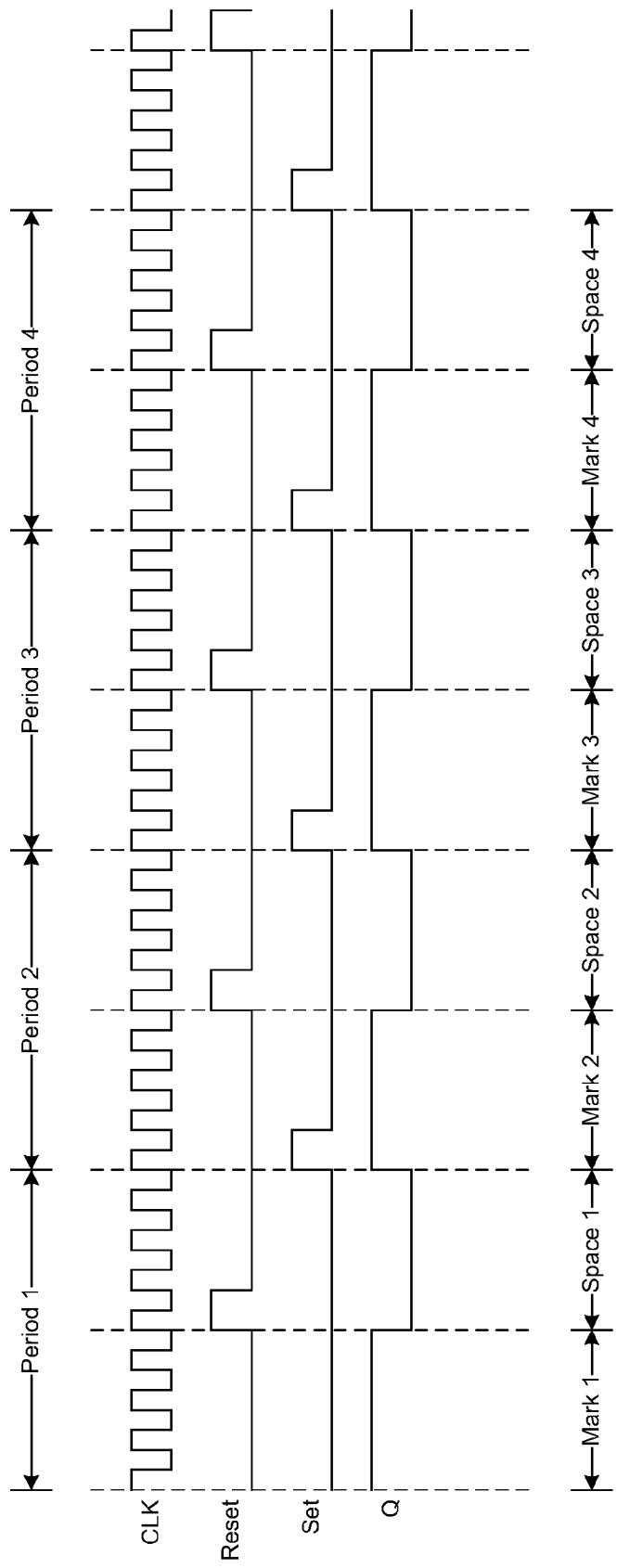
FIG. 1B is a timing diagram illustrating the timing for the pulse-width modulation circuit of FIG. 1A, according to an embodiment.

Counter 110 may continue to count upward from the duty cycle count value 120. Terminal count 130 may contain a value corresponding to the length of the whole period of the PWM circuit 100. Digital comparator 150 compares the value of terminal count 130 to the current value of counter 110. When digital comparator 150 determines that the value of counter 110 has reached the terminal count 130, the output of digital comparator 150 is set to high and applied to the "Set" input of flip flop 160. When the "Set" input of flip flop 160 is high, the output Q of flip flop 160 will be changed back to a high state. Duty cycle count 120 and terminal count 130 may have different values so that the "Reset" and "Set" inputs of flip flop 160 will not both be high at the same time. Alternatively, the output of flip flop 160 may be configured to output a high state when both set and reset inputs are asserted in order to allow for a 100% duty cycle when the duty cycle and terminal counts have the same value. The high output of digital comparator 150 may also be applied to the Rst terminal of counter 110. This may cause the counter 110 to reset to zero or to the initial value, and begin counting upwards again. A timing diagram shown in FIG. 1B illustrates how the output Q alternates in response to the counter reaching the duty cycle count value (Reset) and the terminal count value (Set). Each PWM period (e.g., Period 1, Period 2, etc.) represents a full cycle of the output Q switching between a high state (e.g., Mark 1) and a low state (e.g., Space 1). FIG. 1B and the following timing diagrams illustrate asynchronous Set and Reset inputs (i.e., the output changes immediately in response to a change on the input rather than waiting until the next active clock edge to take effect). In other embodiments, however, synchronous inputs may be used and the timing may differ slightly as would be apparent to one of skill in the art.

In one embodiment, PWM circuit 100 may be controlled by PWM control circuit 170. As will be described below, PWM control circuit 170 may control the duty cycle count 120, terminal count 130, and/or clock signal CLK to implement the constant clock, synchronized variable clock, or hybrid variations for reducing EMI while maintaining a constant duty cycle. In one embodiment, the output of PWM circuit 100 may be applied to drive a load 180, such as for example, a motor. FIG. 1 and the following block diagrams illustrate the functionality of various digital implementations of PWM circuits. It should be understood that in other embodiments, other functionally equivalent alternative implementations may be used, as apparent to one of skill in the art.

Figure 2A:
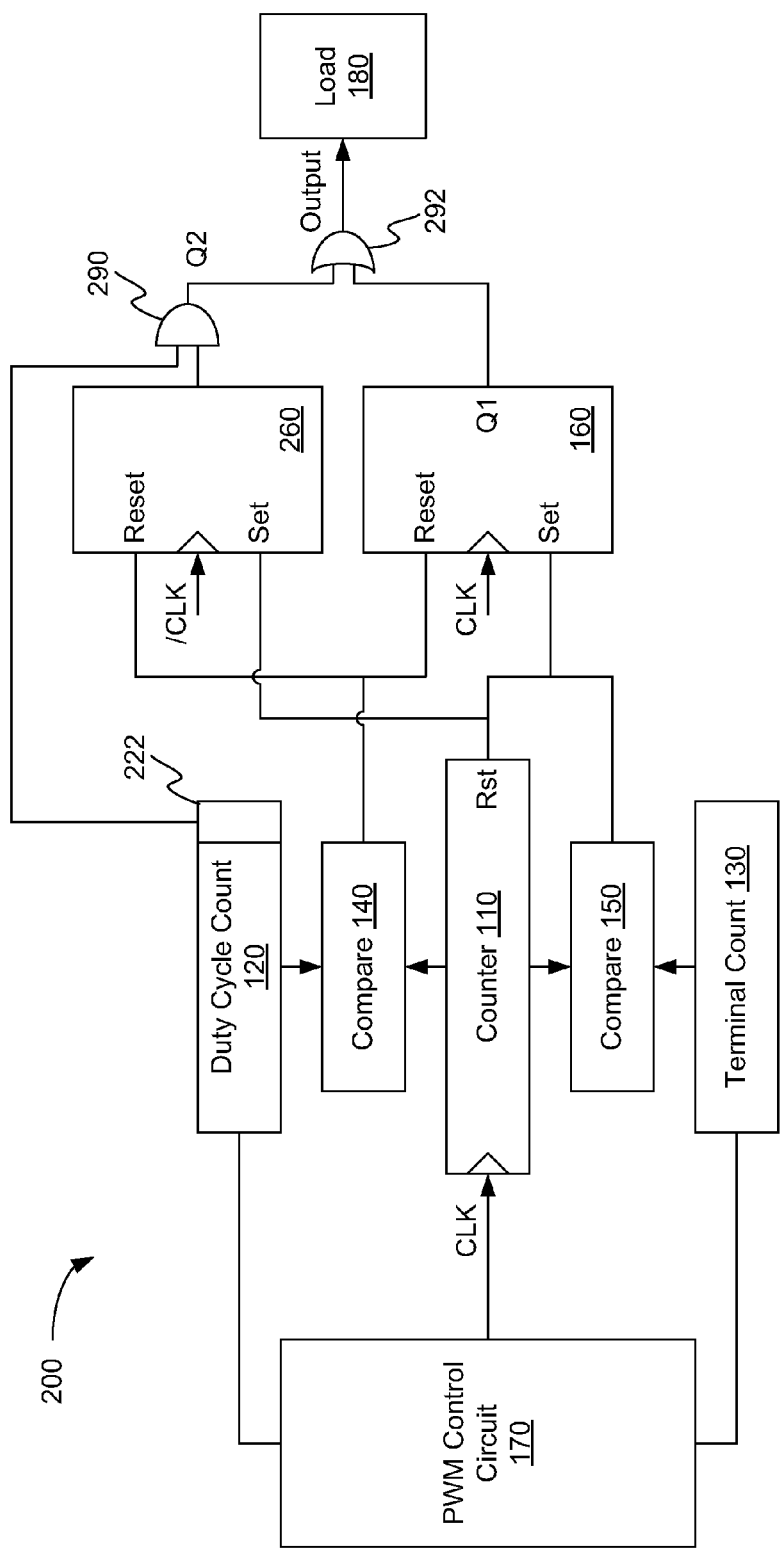
FIG. 2A is a block diagram illustrating a pulse-width modulation circuit with improved resolution, according to an embodiment.

FIG. 2A is a block diagram illustrating a pulse-width modulation circuit with improved resolution, according to an embodiment of the present invention. In one embodiment, the least significant bit of the duty cycle count 120 is used to control a half-cycle delay of the mark-space transition for PWM circuit 200. For, example, if the least significant bit is a "1," then the transition from high to low (or low to high) is delayed by half a PWM period because an inverted clock /CLK is used to clock an additional flip flop 260, so that changes in the flip flop output are delayed by half a clock cycle relative to the output of flip flop 160. If the least significant bit it is a "0" then the transition is not delayed.

Figure 2B:
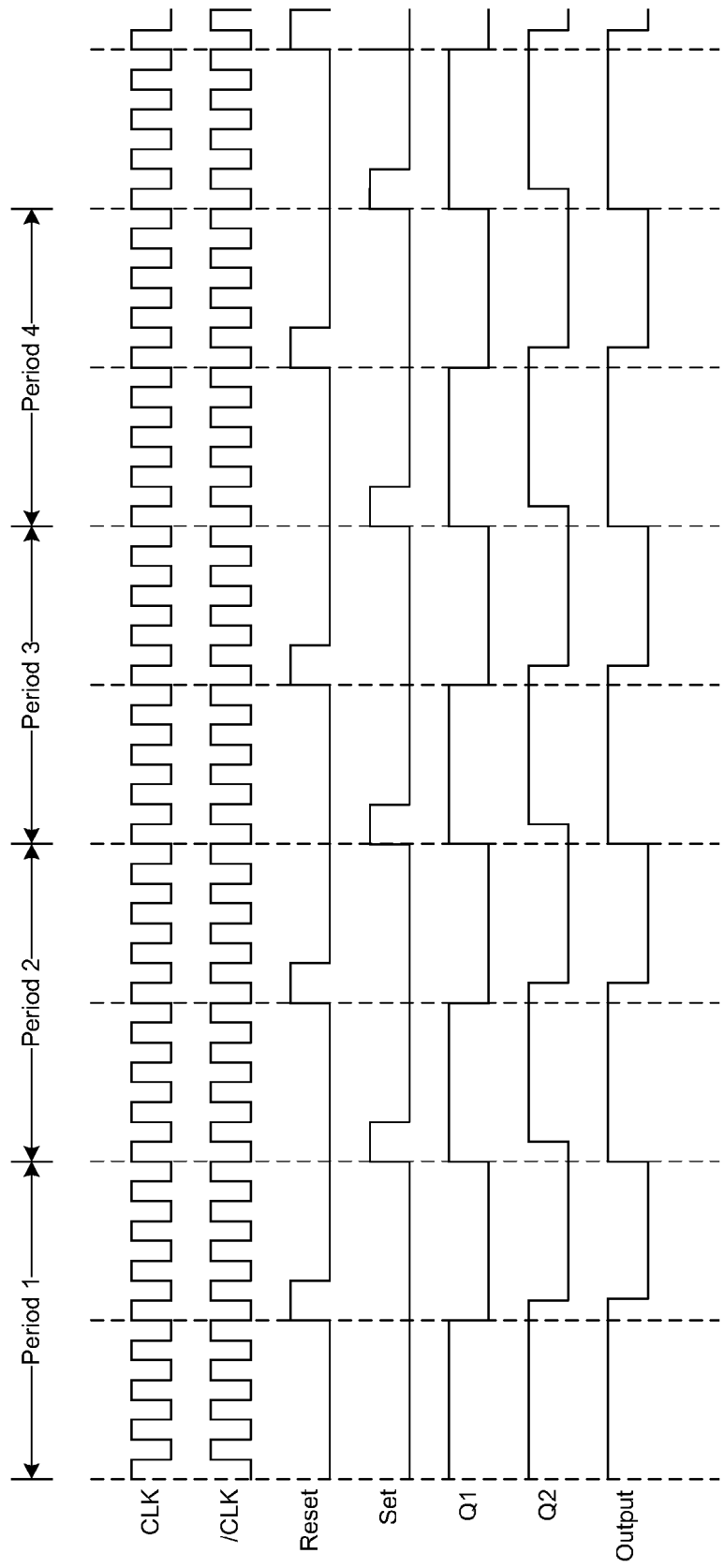
FIG. 2B is a timing diagram illustrating the timing for the pulse-width modulation circuit with improved resolution of FIG. 2A, according to an embodiment.

In one embodiment, the output of digital comparator 140 is applied to the "Reset" inputs of both flip flop 160 and flip flop 260 and the output of digital comparator 150 is applied to both "Set" inputs. In other embodiments, the connections may be reversed. The output Q2 of flip flop 260 may be logically combined with the least significant bit 222 of duty cycle count 120 (e.g., through AND gate 290). In other embodiments, some other bit or value may be used. The output of AND gate 290 may be logically combined with the output Q1 of flip flop 160 (e.g., through OR gate 292) to form the output of PWM circuit 200. In other embodiments, some other combination of logic gates or circuits may be used. As the least significant bit 222 alternates between "0" and "1" the output of PWM circuit 200 may be controlled to extend the "mark" portion of the duty cycle by half a clock period. A timing diagram shown in FIG. 2B illustrates how the output Q2 of flip flop 260 may be delayed by half a clock cycle relative to the output Q1 of flip flop 160 and how the output of PWM circuit 200 is affected.

One of skill in the art will note that the implementation of FIG. 2A is one of many possible implementations of this concept. For example, a similar delay (not shown) may be implemented to allow control of the PWM period with less than whole clock cycle resolution. This is one of several approaches to implementation of a "high resolution" PWM, which may be broadly defined as any mechanism that allows the duty cycle and/or the period of a PWM to be controlled with finer time resolution than the clock period. A variety of synchronous and asynchronous circuit design techniques may be used to apply a signal or clock which is delayed (or advanced from) the clock signal to create a delay of either the mark-space or space-mark transition.

In the example of FIG. 2A, an inverted clock /CLK is used to create a half-cycle delay. In another embodiment, a phase-locked loop may be used to create clocks with multiple phases, and a "phase picker" used to select one of the available phases to control a delayed mark-space and/or space-mark transition. In another embodiment, a tapped delay line may be used to create a variable delay. A tapped delay line may be implemented, for example, using a chain of inverters. In many implementations, a tapped delay line may be sensitive to variations in temperature, voltage and/or semiconductor process manufacturing parameters. In one implementation the tapped delay line may be calibrated against the clock signal to determine which taps have the desired timing.

Regardless of the implementation, in a high-resolution PWM circuit, one or more additional bits of resolution are achieved by using one or more bits to select between two or more possible delayed (or un-delayed) signals or clocks. For example, two bits may be used to select between an undelayed signal and signals delayed by 25%, 50% or 75% of the clock period. In such an implementation of a 16-bit PWM, the PWM period may be 16536 clock periods, and a 14-bit counter may be used, with the two least significant bits of the duty cycle and/or terminal count register being used to control the delay circuit.

Figure 3:
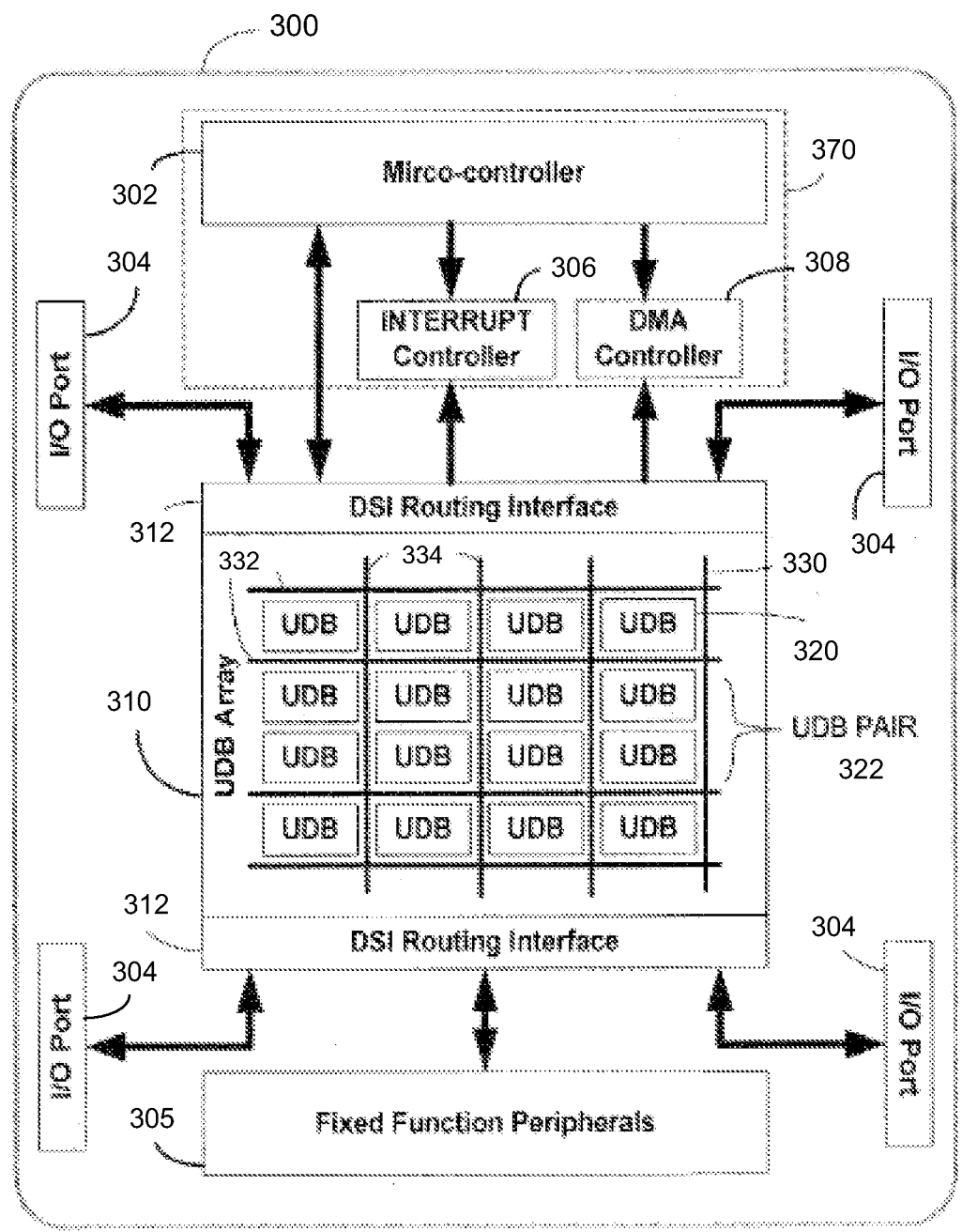
FIG. 3 is a schematic block diagram illustrating an example PSoC architecture that includes a Universal Digital Block (UDB) array, according to an embodiment.

FIG. 3 is a schematic block diagram illustrating an example PSoC architecture that includes a Universal Digital Block (UDB) array, according to an embodiment of the present invention. FIG. 3 includes a high level view of a Universal Digital Block (UDB) array 310 contained within a Programmable System on a Chip (PSoC) Integrated Circuit (IC) 300. The UDB array 310 may include a programmable interconnect matrix 330 that connects together the different UDBs 320. The individual UDBs 320 may each include a collection of uncommitted logic in the form of Programmable Logic Devices (PLDs) and structural dedicated logic elements that form a datapath.

The UDB array 310 is arranged into UDB pairs 322 that each include two UDBs 320 that can be tightly coupled to a shared horizontal routing channel 332. The UDB pairs 322 can also be programmably connected to the horizontal routing channels 332 of other UDB pairs 322 either in the same horizontal row or in different rows through vertical routing channels 334. The horizontal and vertical routing channels and other switching elements are all collectively referred to as the interconnect matrix 330.

A Digital System Interconnect (DSI) routing interface 312 connects a micro-controller system 370 and other fixed function peripherals 305 to the UDB array 310 as well as one or more I/O ports 304. The micro-controller system 370 includes a micro-controller 302, an interrupt controller 306, and a Direct Memory Access (DMA) controller 308. The other peripherals 305 can be any digital or analog functional element in PSoC 300. The DSI 312 is an extension of the interconnect matrix 330 at the top and bottom of the UDB array 310.

Computing devices such as PSoC 300 includes a number of features that enable the implementation of sophisticated PWM drive circuits such as PWM circuits 100 and 200 discussed above. The programmable logic array (e.g., UDB array 310) can be used to create a tapped delay line for implementation of high-resolution PWM, using a combination of any of a p-term array, inverters, local interconnect and a Global System Interconnect (GSI). In one implementation these delays may be calibrated against an internal oscillator, but in other applications where closed loop feedback is employed, it may not be necessary to know precisely the magnitude of the delay and fine-grain increments or decrements in duty cycle meet the needs of the application. In this case the programmable logic may be dynamically reconfigured to increase or reduce the delay. In one embodiment, the delay may be varied by changing the routing of signals between logic elements. In another embodiment, logic elements may be either added or removed in combination with routing changes.

In another embodiment, DMA may be used to allow a table of terminal and/or duty cycle count values to be pre-calculated and stored in main memory and transferred using DMA to the PWM circuit as or shortly after the counter resets as each terminal count is reached. Typically the DMA transfer may be used to load the register holding the buffered count value, but in some cases the DMA may be used to transfer new count values directly into the terminal and duty cycle count registers. This latter implementation is practical mainly in applications where very low duty cycles are rarely used, as this gives time for the new count value to be loaded after the counter resets to zero and before the duty cycle count value is loaded. In other applications, where the duty cycle count only ever changes by small increments, the new duty cycle count value may be DMAed directly into the duty cycle count register shortly after the mark-space transition, and the terminal count register can be similarly updated via DMA shortly after the space-mark transition.

In another embodiment, programmable logic can be used to implement the whole PWM circuit, or programmable logic can be used in combination with a basic fixed function counter/timer/PWM blocks to enhance the functionality of the basic fixed function PWM blocks.

Figure 4A:
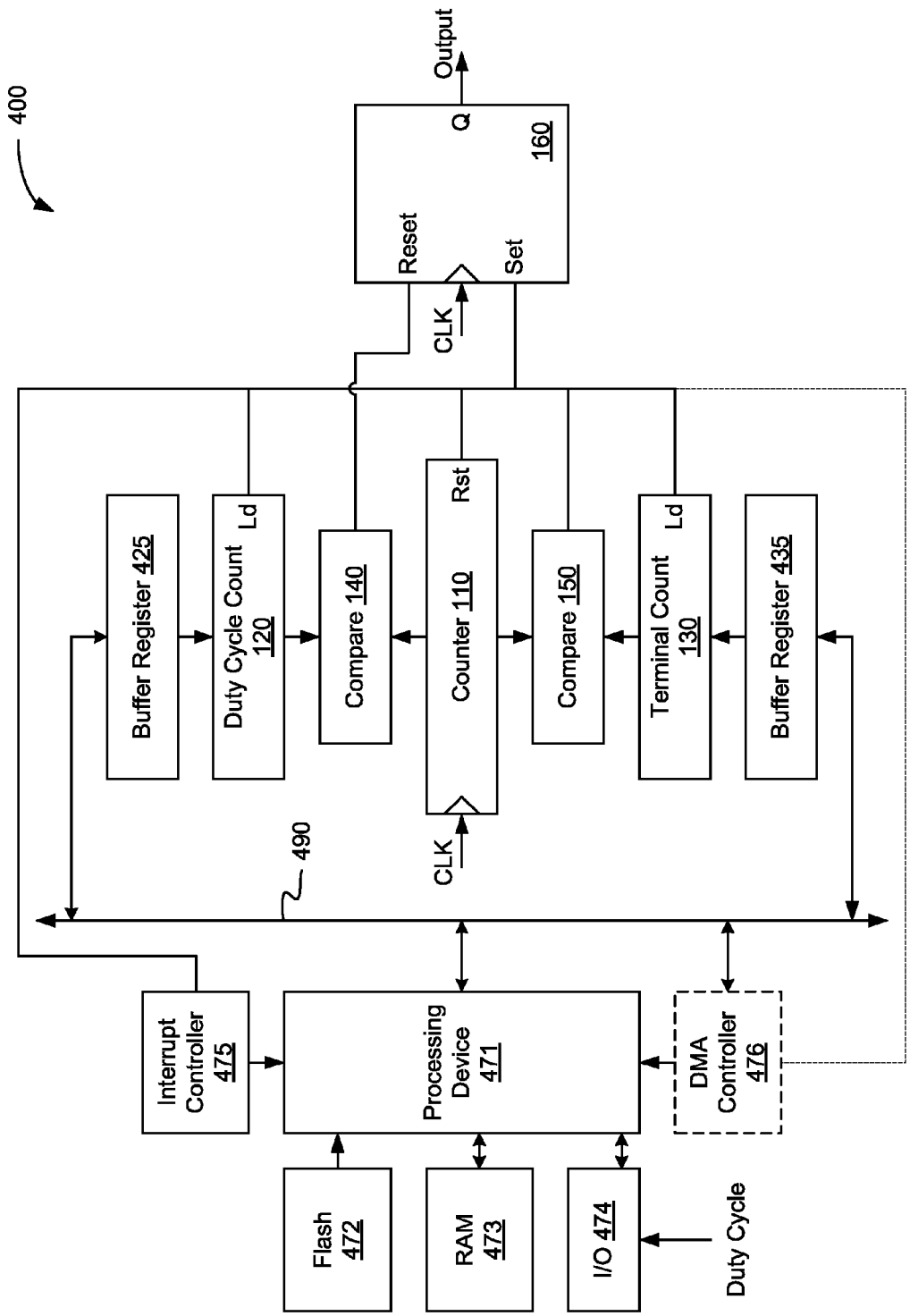
FIG. 4A is a block diagram illustrating a pulse-width modulation circuit with a constant clock, according to an embodiment.

FIG. 4A is a block diagram illustrating a pulse-width modulation circuit with a constant clock, according to an embodiment. In one embodiment, PWM circuit 400 is similar to PWM circuit 100 described above with respect to FIG. 1A. In this case, however, PWM circuit 400 includes buffer registers 425 and 435 which feed, duty cycle count register 120 and terminal count register 130, respectively. In another embodiment, PWM circuit 400 may include additional circuitry (not shown) to increase the PWM resolution, such as for example an additional flip flop or latch, as shown in FIG. 2A.

PWM circuit also includes details of the PWM control circuit. In this embodiment, the PWM control circuit includes processing device 471, flash memory 472, RAM 473, I/O interface 474, interrupt controller 475 and DMA controller 476. These components of the PWM control circuit may be connected to the rest of the PWM circuit through a bus 490. Any of the signals provided over bus 490 may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

For purposes of illustration, we can assume that PWM circuit 400 has 16-bits of resolution, has a 1 millisecond PWM period and is clocked by clock signal CLK having a frequency of 50 Megahertz. This results in a base terminal count value of 50,000 representing the length of the PWM period. In one embodiment, a table of terminal count values may be stored in Flash 472 or RAM 473. The table may include a number of terminal count values that vary either above, below, or above and below the base terminal count value. In one embodiment, the table may include at least 16 or preferably 50-100 different values. These values define the modulation depth of the frequency spreading as well as the spreading profile. In one embodiment, the terminal count values may represent a modulation depth (i.e., variance from the base terminal count value) of approximately 1-3%. In one embodiment, the values may be selected according to a known spreading profile (e.g., triangle, "Hershey kiss," etc.) or may be selected pseudo-randomly. In one embodiment, the table may also include duty cycle count values corresponding to each terminal count value, calculated to maintain the desired duty cycle. The desired duty cycle may be received as an input at I/O interface 474. An example of such a table is shown below as Table 1.

TABLE 1

| Terminal Count | Duty Cycle Count |
|---|---|
| 50,000 | 25,000 |
| 50,500 | 25,250 |
| 51,000 | 25,500 |
| 51,500 | 25,750 |
| 52,000 | 26,000 |
| 51,500 | 25,750 |
| 51,000 | 25,500 |
| 50,500 | 25,250 |
| 50,000 | 25,000 |

Figure 4B:
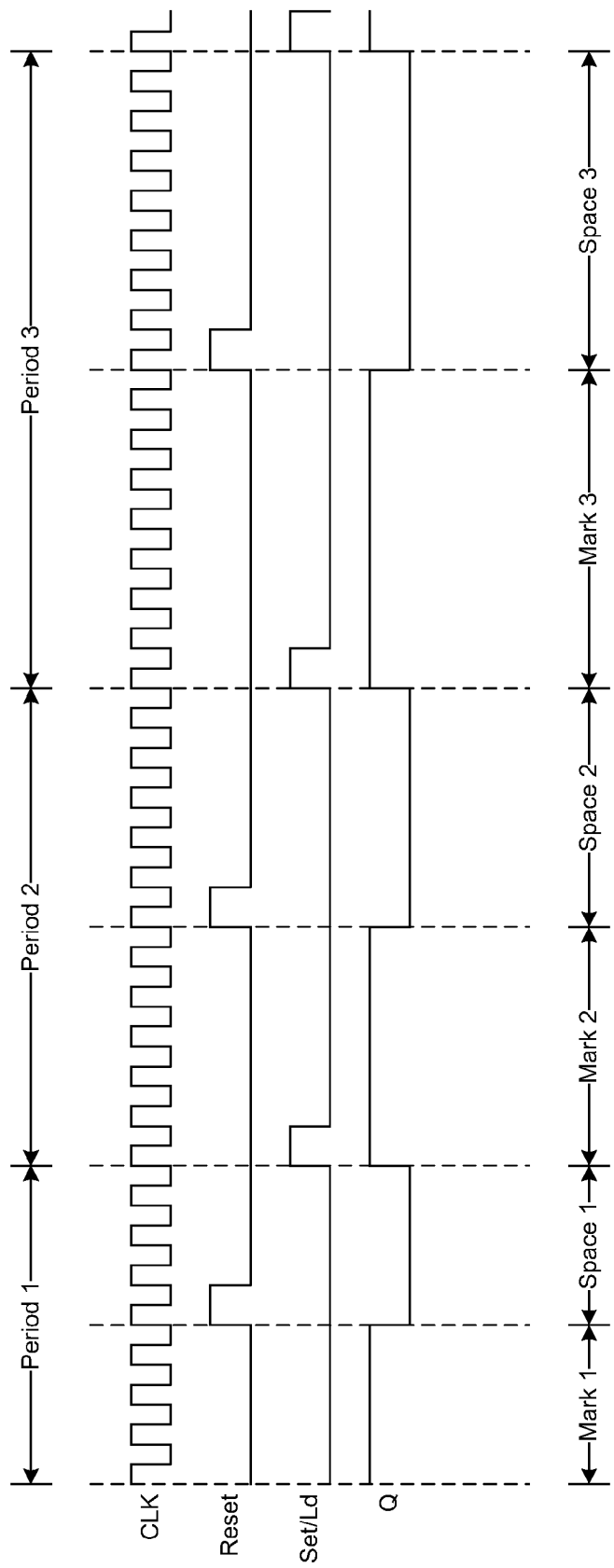
FIG. 4B is a timing diagram illustrating the timing for the pulse-width modulation circuit with a constant clock of FIG. 4A, according to an embodiment.

At the end of each PWM period (approximately every millisecond), as the terminal count is reached, the next duty cycle count value 120 and terminal count value 130 are loaded automatically from the buffers 425 and 435, respectively. The output of digital comparator 150 may be applied as a load input LD to duty cycle count register 120 and terminal count register 130, signaling each to load the next value from the associated buffer register. In addition, a CPU interrupt and/or DMA request is triggered by interrupt controller 475 and/or DMA Controller 476. On receipt of this interrupt the CPU (or other processing device) fetches the next terminal count value in the table (such as Table 1). The processing device 471 may then compute the new duty cycle register value by multiplying the terminal count value from the table by the duty cycle (a value between 0 and 1 which may be a floating point value but will more commonly be stored as a 16-bit fixed-point value with 0x0000 representing 0 and either 0xFFFF or 0x10000 representing 1). Alternatively, both the duty cycle count and terminal count values may be pre-calculated and stored in a table. After computing the next duty cycle register value, the buffer registers for the duty cycle 425 and terminal count value 435 are loaded with these values. The buffers 425 and 435 may be loaded either directly by the processing device 471 or using DMA by DMA controller 476. This process may repeat until all values from the table have been loaded to the buffer registers. A timing diagram shown in FIG. 4B illustrates how the output Q maintains a constant duty cycle during each period and a constant average duty cycle over all periods, even as the length of the PWM period is varied. For example, Period 2 is 50% longer than period 1 (i.e., due to different duty cycle and terminal count values), however the length of Mark 2 and Space 2 remain proportional to the lengths of Mark 1 and Space 1 to maintain a constant duty cycle.

In one embodiment, PWM circuit 400 may be an edge-aligned PWM. For example, if the terminal count is set at 50,000, counter 110 (which may be a down counter) starts counting at 50,000 and counts down to the value in duty cycle count register 120. When the count reaches the duty cycle count, the output polarity changes to indicate this. When the counter 110 reaches zero, the terminal count value is reloaded into register 130 and the cycle begins again. Many variations on this basic theme are possible, such as using up-counters instead of down-counters, varying the polarity selection, using complementary outputs, etc.

In another embodiment, PWM circuit 400 may be a center-aligned PWM. With a center-aligned PWM, the counter 110 counts up from zero to the terminal count value from register 130 and then counts down back to zero. The duty cycle digital comparator 140 detects a match on the up-count as well as the down-count; and the output polarity changes on the up-count cycle and then again on the down-count cycle.

In one embodiment, there may be three independent PWMs with true and complementary outputs each, for a total of six outputs driving the load. The edge-aligned PWM outputs will all reload at the same time causing more switching noise and EMI. Also, there are two transitions per cycle for the edge-aligned PWM as opposed to one for the center-aligned PWM (i.e. clock related noise is pushed up the spectrum which may be an advantage in some applications). Thus, in some embodiments, center-aligned PWMs may be used as they generate less noise. In addition, when complementary outputs are used, it is required that the true and complementary output switching be separated in time because load delay. Transient crowbar current can result if a break-before-make signal pair relationship is not used. This may be called a dead-band and should be programmable.

Figure 5:
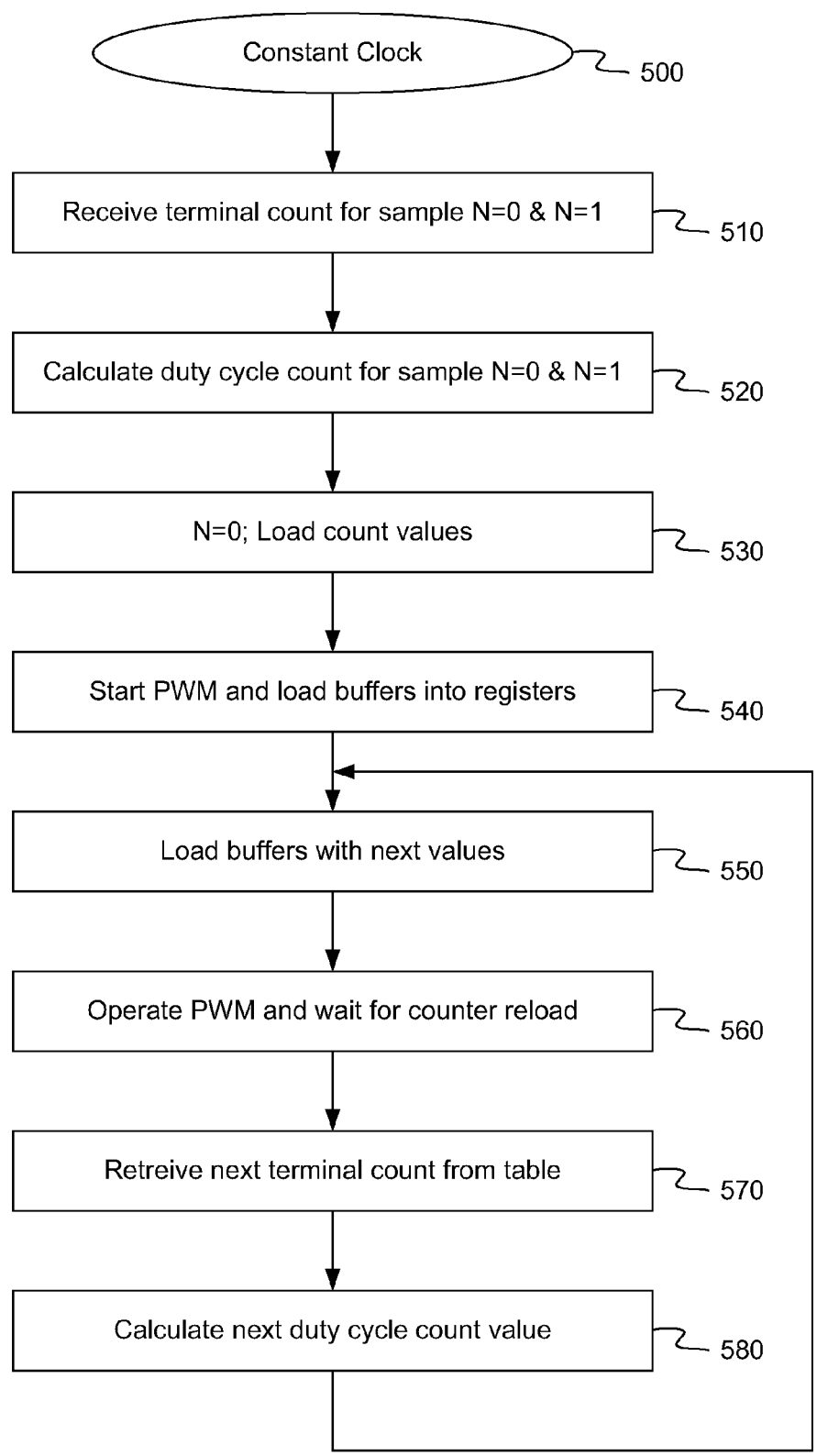
FIG. 5 is a flow diagram illustrating an EMI reduction method with a constant clock, according to an embodiment.

FIG. 5 is a flow diagram illustrating an EMI reduction method with a constant clock, according to an embodiment of the present invention. The method 500 may be performed by processing logic that comprises hardware (e.g., circuitry, dedicated logic, programmable logic, microcode, etc.), software (e.g., instructions run on a processing device to perform hardware simulation), or a combination thereof. The processing logic is configured to spread EMI across a range of frequencies while maintaining a constant duty cycle using PWM. In one embodiment, method 500 may be performed by PWM control circuit 170, as shown in FIG. 1A, or processing device 471 as shown in FIG. 4A.

Referring to FIG. 5, at block 510, method 500 receives the terminal count values for the first two samples to be modulated. The sample numbers may be represented by the variable N with N=0 representing the first sample, N=1 representing the second sample, and so on. The terminal count values may be received from a table, such as Table 1, which may be stored in Flash memory 472, RAM 473, or some other storage device. At block 520, method 500 calculates a duty cycle count value for each of the first two samples. The duty cycle count value may be determined by multiplying the duty cycle times the terminal count value. The resulting duty cycle count value may be stored, for example, in Table 1. At block 530, method 500 loads the terminal and duty cycle count values for the first sample (N=0) into buffer registers 435 and 425, respectively.

At block 540, method 500 starts the PWM circuit 400 and loads the values of buffers 425 and 435 into duty cycle count register 120 and terminal count register 130, respectively. Counter 110 begins counting (e.g., up or down from an initial value) at a frequency of the clock signal CLK. In one embodiment, the frequency of the clock signal CLK remains constant across all PWM periods. At block 550, method 500 loads buffers 425 and 435 with the count values for the second sample (N=1). The values may be retrieved from Table 1.

At block 560, method 500 operates the PWM and waits for the counter 110 to reload. The PWM circuit may operate as described above with respect to FIG. 1A by comparing the values of registers 120 and 130 to the current value of counter 110 and applying signals to flip flop 160 as appropriate. At block 570, method 500 retrieves the next terminal count value from Table 1. The output of digital comparator 150 may be applied to interrupt controller 475 which asserts an interrupt to processing device 471. At block 580, method 500 calculates the next duty cycle count value for the corresponding terminal count value. The interrupt may cause processing device 471 to read the terminal count value and calculate the duty cycle count value accordingly. Method 500 may return to block 550 and load the count values into buffers 425 and 435. Blocks 550-580 may be repeated for all of the samples having a terminal count value in Table 1, and then the whole process may be repeated again starting with the first entry in the table.

In the embodiments described above, the duty cycle has remained constant across all PWM periods. In other embodiments, however, the PWM duty cycle may change regularly, as often as every PWM period. For example, the PWM circuit may be used as part of a control loop in which a feedback signal may cause the duty cycle to increase or decrease by either a fixed or variable interval with each PWM period. In another case the PWM circuit may be used to synthesize a waveform, with the duty cycle changing to create a predetermined waveform according to a table of values or calculated according to a formula or algorithm. In these cases, the PWM circuit may be configured to maintain a duty cycle that matches a desired duty cycle.

Figure 6:
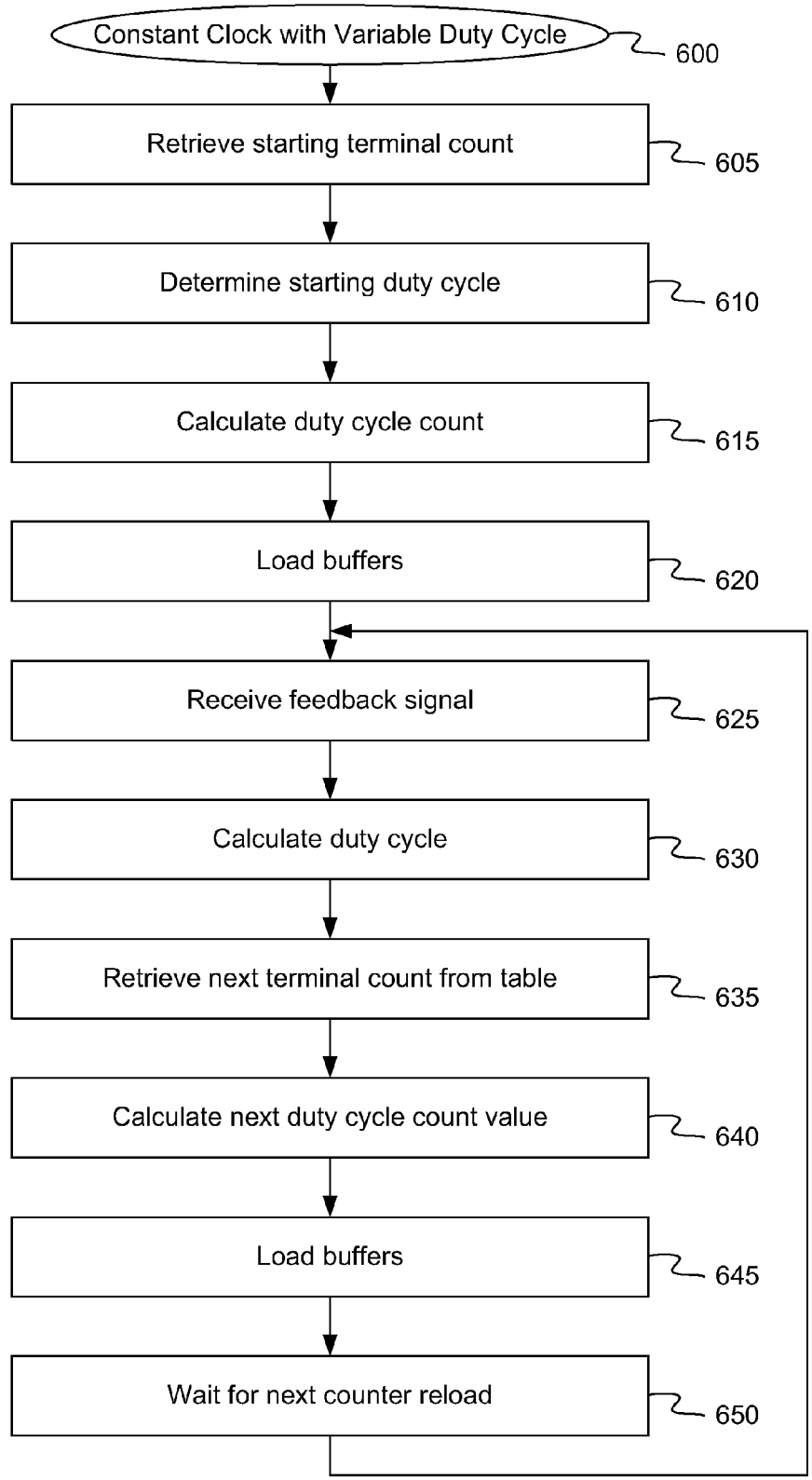
FIG. 6 is a flow diagram illustrating an EMI reduction method with a constant clock and variable duty cycle, according to an embodiment.

FIG. 6 is a flow diagram illustrating an EMI reduction method with a constant clock and variable duty cycle, according to an embodiment. In method 600, the processing logic is configured to spread EMI across a range of frequencies while maintaining a constant duty cycle for each period using PWM, however, the duty cycle may vary between periods. In one embodiment, method 600 may be performed by PWM control circuit 170, as shown in FIG. 1A, or processing device 471 as shown in FIG. 4A.

Referring to FIG. 6, at block 605, method 600 retrieves the starting terminal count value. The starting terminal count value may be stored in Table 1, for example, which may be stored in Flash 472 or RAM 473. The starting terminal count may be calculated based on the frequency of clock signal CLK and the PWM period length. At block 610, method 600 determines the starting duty cycle. In one embodiment, the duty cycle may be received as in input at I/O terminal 474. The duty cycle may be received as a percentage value or a decimal value between zero and one. The duty cycle may be provided, for example, by a user, a software process, or some other source. At block 615, method 600 calculates the duty cycle count. The duty cycle count may be calculated using the duty cycle value from block 610 and may be a value proportional to the value of the starting terminal count. At block 620, method 600 loads the duty cycle count and the terminal count into buffers 425 and 435 and then into duty cycle count register 120 and terminal count register 130. Optionally, the values may be loaded directly into registers 120 and 130.

At block 625, method 600 receives a signal (e.g., a feedback signal). In one example a circuit may provide an input indicating that a condition exists requiring that the duty cycle needs to increase or decrease. Such a circuit may include a voltage comparator comparing an output voltage of a circuit coupled to the PWM signal with a reference signal, such that if the voltage exceeds the reference signal voltage by more than a threshold amount the feedback signal indicates that the PWM duty cycle should be reduced, and if the voltage is less than the reference signal voltage by more than a threshold amount the feedback signal indicates that the PWM duty cycle should be increased. In another example, the feedback signal may include an indication of an absolute or relative amount by which the PWM duty cycle should be increased or decreased.

At block 630, method 600 calculates a new duty cycle value based on the feedback signal. The duty cycle value may be calculated by processing device 471 and stored in Flash 472, RAM 473, or some other storage device. At block 635, method 600 receives the next terminal count value. The terminal count value may be a subsequent value from the spreading profile stored, for example, in Table 1. At block 640, method 600 calculates the next duty cycle count value corresponding to the new duty cycle from block 630. The duty cycle count value may be determined, for example, by multiplying the duty cycle and the terminal count value.

At block 645, method 600 loads the terminal count value and duty cycle count values into buffers 120, 130, 425, and 435. The values are compared to the current value of counter 110, as discussed above. At block 650, method 600 waits for the counter to reload. When counter 110 reaches the terminal count value in register 130, a reset signal is applied to counter 110 causing it to reset to the initial value (e.g., zero). Method 600 returns to block 625 to wait for another feedback signal to be received. Blocks 625-650 may be repeated for each new feedback signal and duty cycle that are received.

Figure 7A:
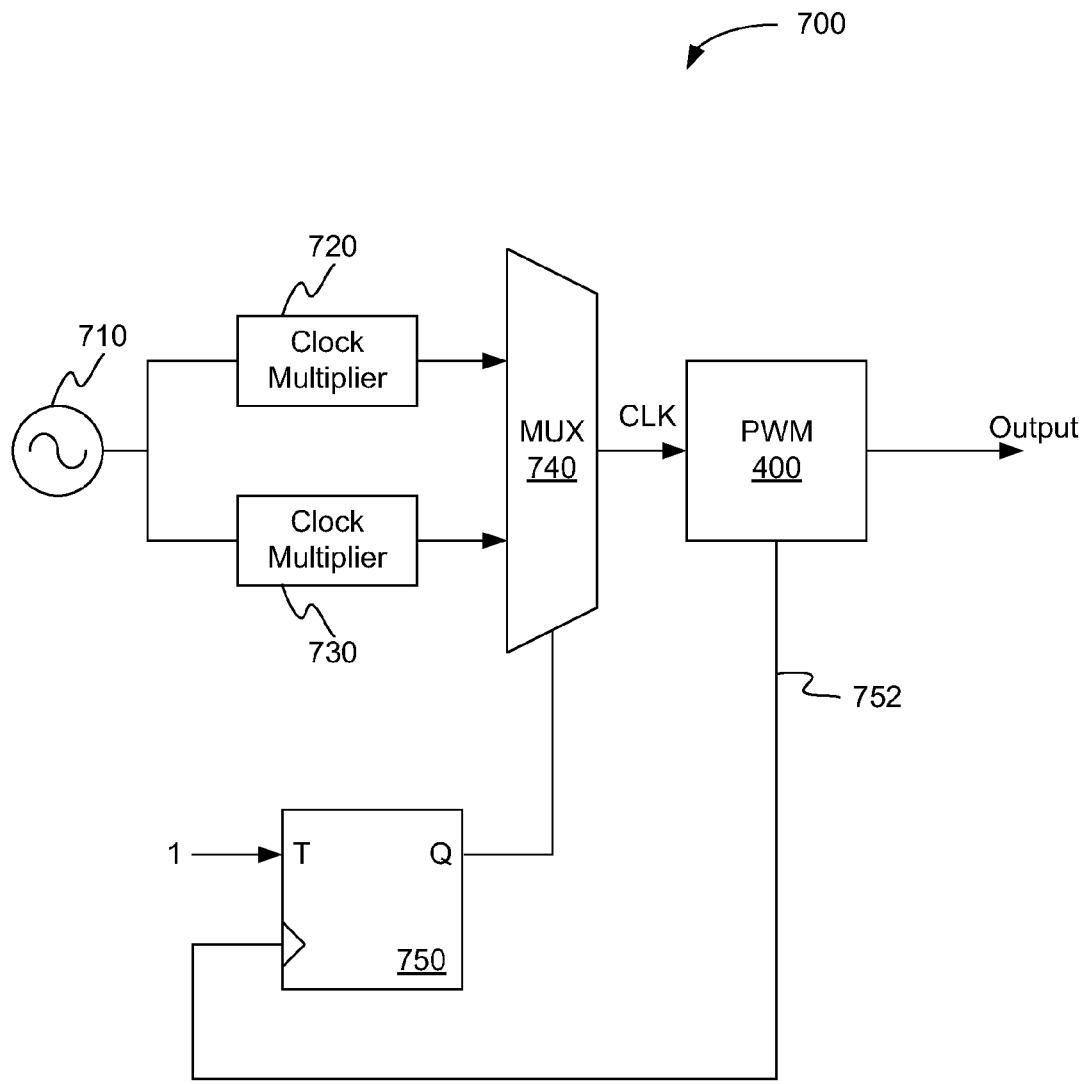
FIG. 7A is a block diagram illustrating a pulse-width modulation circuit with a synchronized variable clock, according to an embodiment.

FIG. 7A is a block diagram illustrating a pulse-width modulation circuit with a synchronized variable clock, according to an embodiment of the present invention. In this approach the clock frequency is varied, but the variations are discrete and are synchronized with the PWM period. The variable clock frequency may be generated, for example, using a pair of fractional-N phase locked loops (PLLs) to synthesize a precisely defined clock frequency from a constant lower frequency oscillator. Two such PLLs may be required because the settling time of a PLL may be too long for the near-instantaneous frequency change required. In one example, one PLL is used to clock the PWM circuit while the other PLL is settling to its new value. The clock source for the PWM may be changed when the terminal count resets the counter. Alternatively, other frequency multiplier circuits not comprising a PLL may be used.

FIG. 7A illustrates another embodiment of a circuit 700 that can be used to synchronously vary the clock signal applied to PWM circuit 400. In this embodiment, PWM circuit 400 may be the same as, or similar to, the PWM circuit 200 described above with respect to FIG. 2A. The rest of circuit 700 controls the frequency of the clock signal CLK, which may be provided to PWM circuit 200 as an input. In one embodiment, circuit 700 includes fixed frequency clock source 710, clock multipliers 720, 730, multiplexer 740, and flip flop 750.

Fixed frequency clock source 710 may be any type of oscillator that provides at least one fixed frequency clock signal. In one embodiment, the clock signal may vary marginally with temperature, voltage, etc. and may have small cycle-to-cycle jitter, but may remain substantially constant. Each of clock multipliers 720 and 730 may receive a multiplication value as an input (not shown). In one embodiment, there may be a buffer register (not shown) associated with each clock multiplier 720, 730 that stores one or more multiplication values to be used. The sequence of multiplication values may make up a spreading profile (e.g., triangle, "Hershey kiss," pseudo-random) as shown in FIGS. 7C-7E. The fixed frequency clock signal received from clock source 710 may be applied to each of clock multipliers 720 and 730 as an input. Each of clock multipliers 720 and 730 may output a multiplied clock signal that varies from the fixed frequency clock signal of clock source 710.

FIGS. 7C-7E are diagrams illustrating frequency spreading profiles, according to an embodiment of the present invention. FIG. 7C illustrates a triangle profile, FIG. 7D illustrates a "Hershey kiss" profile, and FIG. 7E illustrates a pseudo-random profile. Each profile shows how the average power changes with respect to frequency. In other embodiments, some other spreading profile may be used.

Figure 7B:
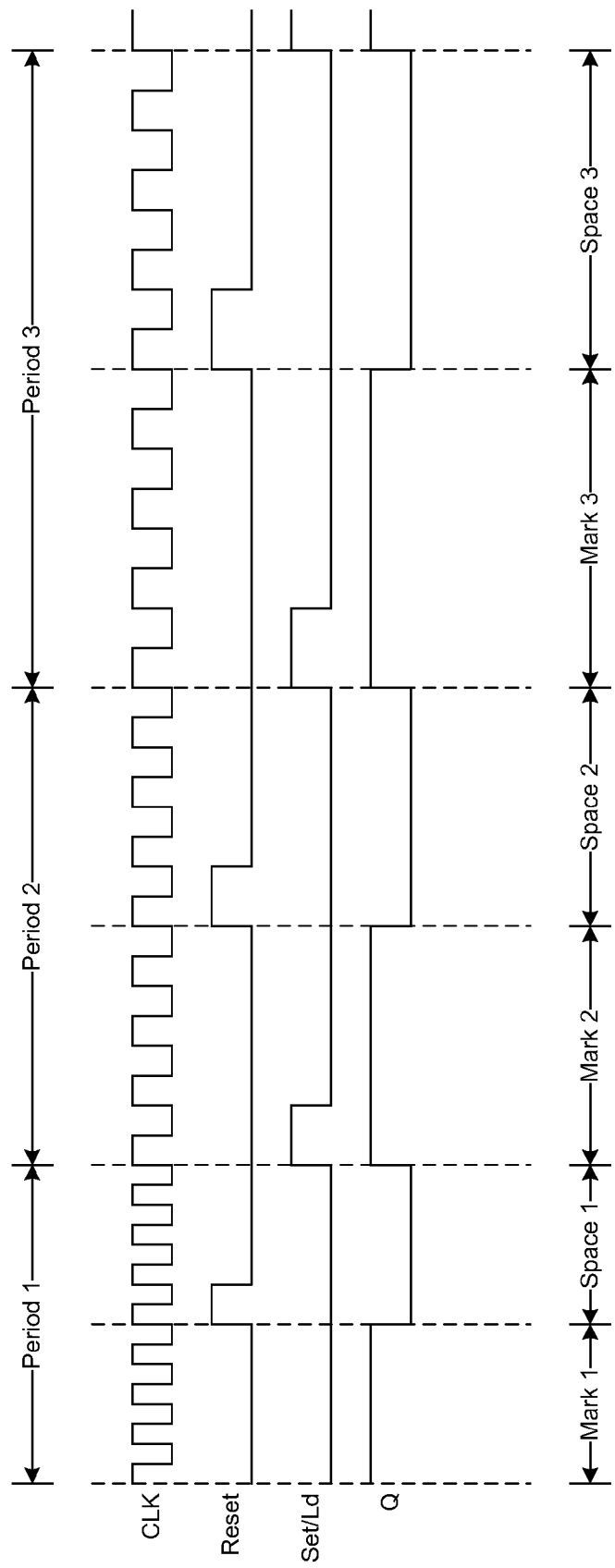
FIG. 7B is a timing diagram illustrating the timing for the pulse-width modulation circuit with a synchronized variable clock of FIG. 7A, according to an embodiment.

Referring again to FIG. 7A, the output of each of clock multipliers 720 and 730 may be applied to multiplexer 740 as inputs. In other embodiments, some other selection circuit may be used. The output of multiplexer 740 is applied to PWM circuit 200 as clock signal CLK, and is controlled by the output Q of flip flop 750. In one embodiment, flip flop 750 may be a T flip flop, however in other embodiments, some other latch or circuit may be used to alternately couple the output of clock multipliers 720 and 730 to the clock input of PWM 200. The T flip flop 750 toggles the output Q between a high and low state whenever the clock input is strobed. In one embodiment, the clock input of flip flop 750 is the output 752 of digital comparator 150 of PWM circuit 200. Digital comparator 150 outputs a high signal when counter 110 reaches the terminal count value 130 signifying the end of the PWM period. By toggling the output Q of multiplexer 740 in response to the output 752 of digital comparator 150 switching to a high state, circuit 700 ensures that the frequency of clock signal CLK changes only at the end of the PWM period. The clock frequency thus remains constant for the duration of each PWM period. When one clock multiplier (e.g., clock multiplier 720) is selected by multiplexer 740, the other clock multiplier (e.g., clock multiplier 730) may be loaded with a new multiplication value from its buffer, according to the associated profile. In other embodiments, additional clock multipliers may be used in circuit 700. A timing diagram shown in FIG. 7B illustrates how the output Q maintains a constant duty cycle during each period and a constant average duty cycle over all periods, even as the frequency of the clock signal CLK is varied. For example, Period 2 is 50% longer than period 1 (i.e., due to a change in the CLK frequency), however the length of Mark 2 and Space 2 remain proportional to the lengths of Mark 1 and Space 1 to maintain a constant duty cycle.

One reason for using a fixed frequency clock source 710 may be a requirement to keep other subsystems synchronized with each other. In such systems it may be required that a single clock source, such as a crystal oscillator, ceramic resonator or on-chip oscillator, be used to clock all subsystems and devices in the design. In other embodiments, however, where such constraints do not exist, it may be preferable to use a programmable oscillator. An example implementation may include a voltage controlled oscillator, digitally programmed using a digital-to-analog converter (DAC), or a digitally controlled relaxation oscillator. In order to provide effective spreading, the digitally controlled oscillator may have fine-grain control over the oscillator frequency. To be effective, typically at least 16 steps will be required over a +/−2 to +/−5% frequency range, and ideally 50-100 steps would be preferable in order to achieve the most effective spreading and thus achieve the greatest possible EMI reduction; however other ranges or numbers of steps may be suitable depending on the requirements of the application. Examples of programmable oscillators may include Voltage controlled Oscillators (VCOs), Relaxation Oscillators, Ring Oscillators, or others. Other terms for such oscillators may include numerically controlled oscillators, digitally controlled oscillators and programmable clocks.

Figure 8A:
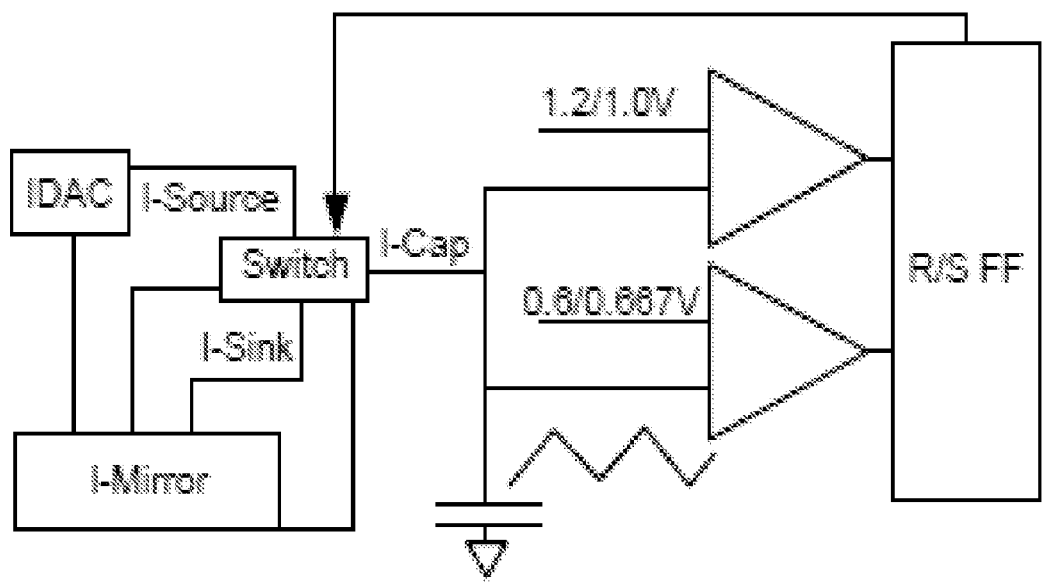
FIGS. 8A and 8B are block diagrams illustrating a variable frequency oscillator, according to an embodiment.
Figure 8B:
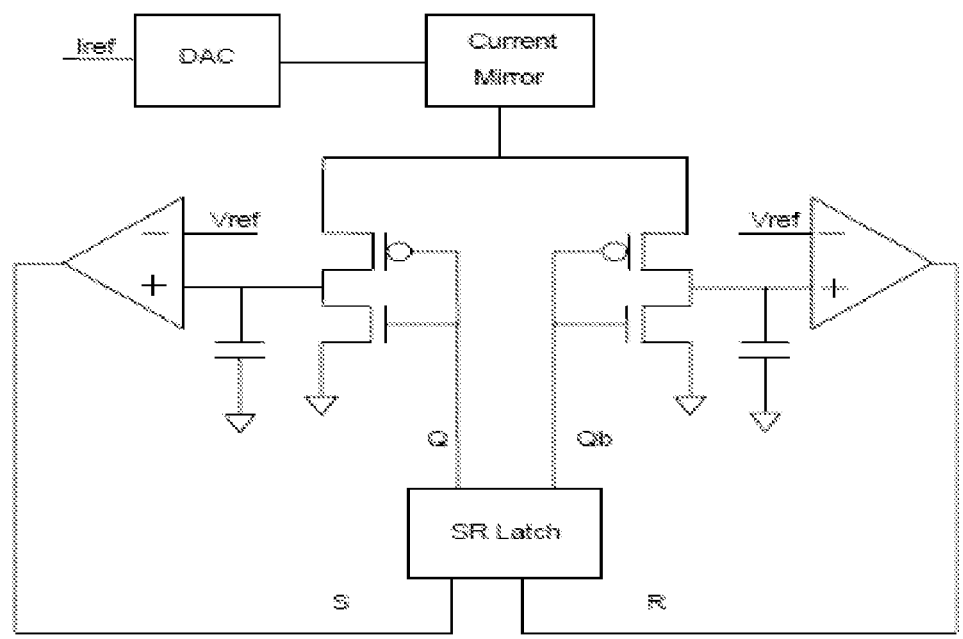

FIGS. 8A and 8B are block diagrams illustrating a variable frequency oscillator, according to an embodiment of the present invention. The illustrated variable frequency oscillator may be, for example, the Internal Main Oscillator (IMO) found on the Programmable System on a Chip (PSoC) devices manufactured by Cypress Semiconductor Corporation. In one embodiment, the IMO includes a current mode relaxation oscillator. The frequency of the IMO is controlled by an IDAC (current mode digital-to-analog converter) which may include an array of replicated current sources and/or current sinks. Depending on the current used to charge and/or discharge a capacitor, the frequency of the relaxation oscillator changes. In the case of the IMO, the number and current of the current sinks and/or sources which are enabled at any one time is used to vary the current, and therefore the oscillator frequency.

In another implementation, a voltage controlled oscillator (VCO) may be controlled by a voltage-mode DAC, the operation of which will be apparent to one of skill in the art. In another implementation, analog control over the oscillator may be used. In one example, an analog "triangle wave" voltage signal may be used to control a VCO. In order to synchronize changes in frequency of the VCO with the PWM period a sample and hold (S/H) circuit may be used. Such circuits will be familiar to those of skill and the art and are not further described herein. Sine waves, and sawtooth waves are examples of alternative analog voltage waveforms, but many other varying voltages may be used to vary the oscillator frequency depending on the desired spreading.

In one example, a triangle wave is fed to the VCO via an S/H circuit. The S/H circuit is may be in a "hold" mode while the PWM counter is counting up to the terminal count. When the terminal count is reached, the S/H circuit samples the continuously varying analog voltage, and holds that voltage for the duration of the subsequent PWM period.

In some embodiments, the clock generation circuit may include a digitally controlled oscillator and one or more frequency dividers together with one or more frequency multipliers. The digitally controlled oscillator (DCO) may be used to generate a clock with a given frequency, which may be fed to a clock divider, the output of which may be fed to a PLL clock multiplier, the output of which may be divided again if necessary. As will be apparent to one of skill in the art, even if the frequency of the DCO itself is limited in its range and/or resolution of variation, an output of almost any frequency can be produced by varying the prescaler, PLL multiplication factor and/or programmable divider ratios. In another embodiment, the combination of frequency division and multiplication may be used to support variable clock constant duty cycle spread spectrum pulse-width modulation, even with a fixed frequency clock source.

Figure 9:
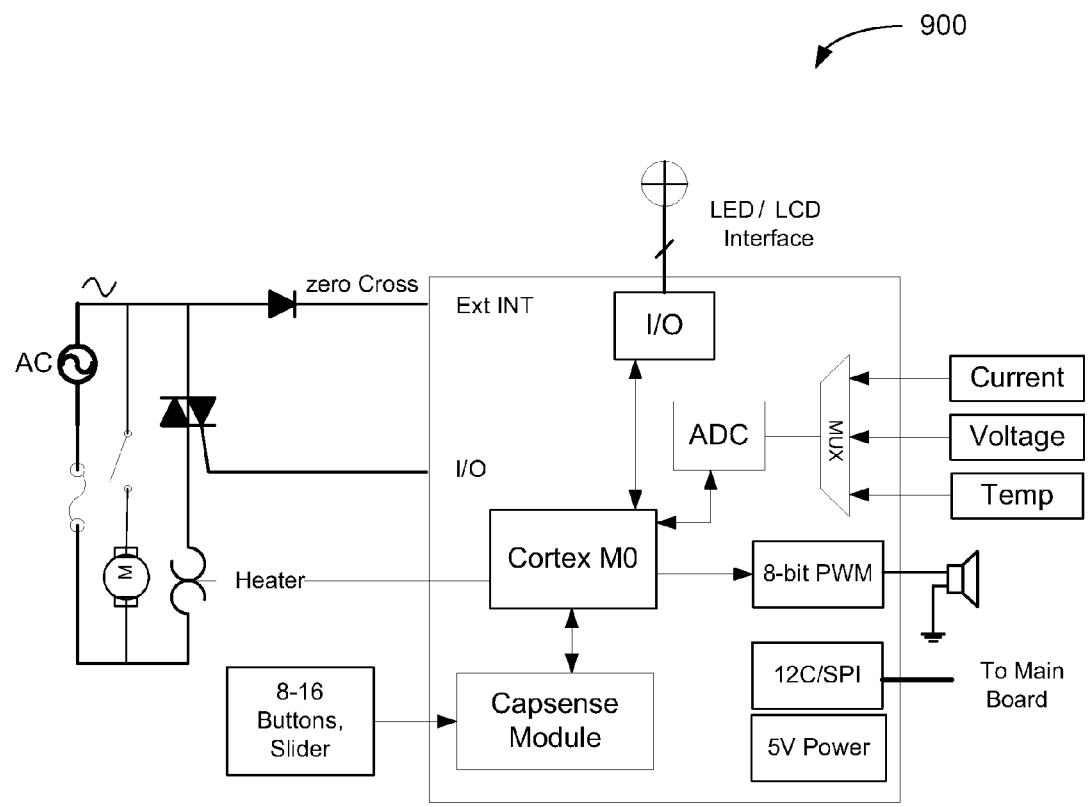
FIG. 9 is a block diagram illustrating a control system for an eBike, according to an embodiment.

As previously discussed, the reduction of EMI may be of particular concern in motor drive applications. One example of motor drive where minimizing EMI is of interest is in electric bicycles or eBikes. FIG. 9 is a block diagram illustrating a control system 900 for an eBike, according to an embodiment of the present invention. In one embodiment, Hall sensing is used in Sensored brushless direct current (BLDC) systems and Back EMF signals are used in Sensorless systems. The motor phases are driven via High-side and/or Low-side MOSFET drivers driven by the PWM outputs of the controller 900. The controller 900 responds to user inputs such as speed command, brake command, etc. and generates appropriate motor-drive outputs to change or maintain the velocity of the E-Bike.

The ADC may be used for both current sensing as well as battery voltage measurement. In the case of excess current, the controller 900 may provide a kill signal to immediately disable the driver FETs. The controller 900 may also generate various mode displays and alarm indicator outputs.

Figure 10:
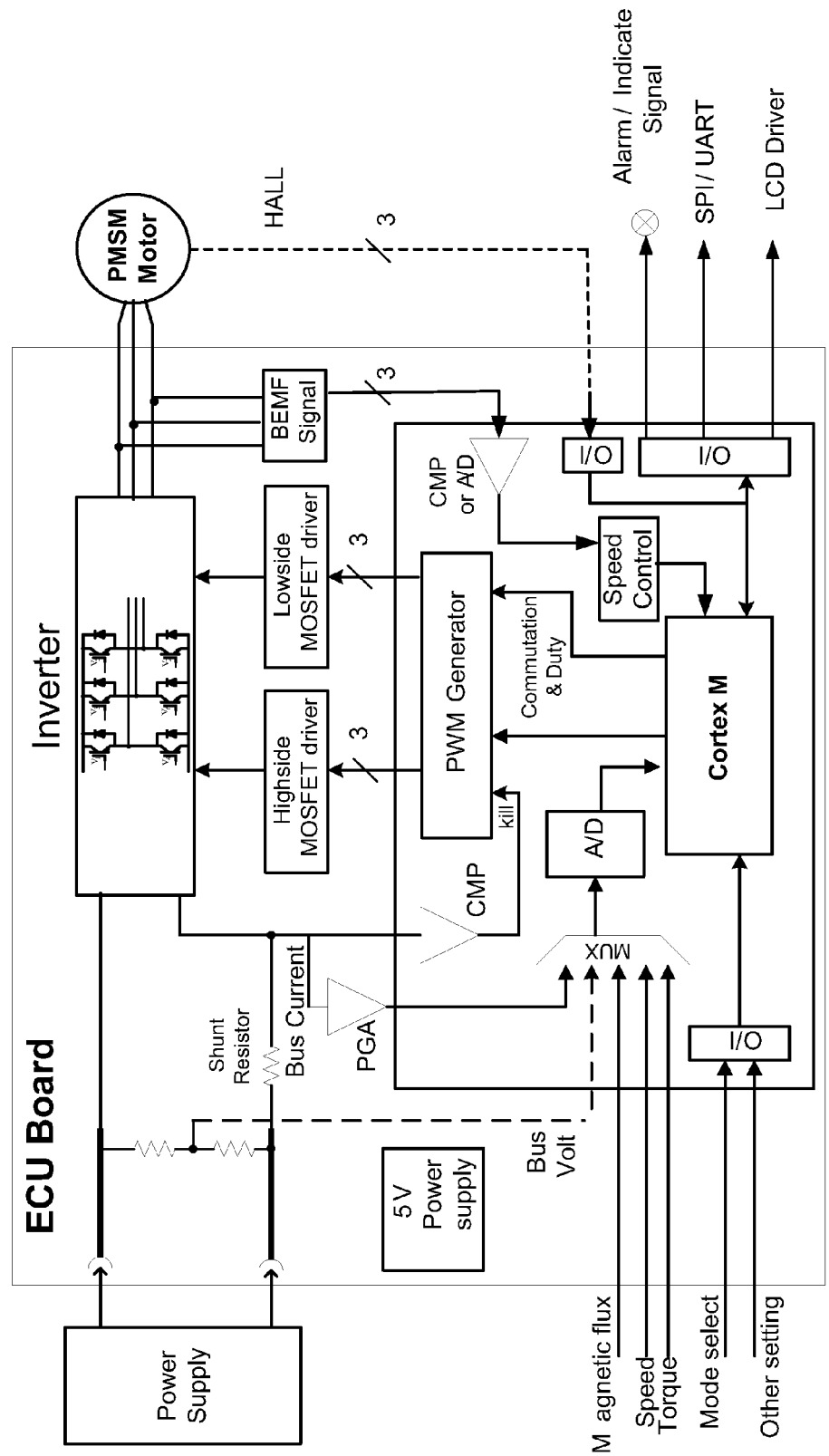
FIG. 10 is a block diagram illustrating a control system for field-oriented control of motors, according to an embodiment.

Another application for the techniques described herein is Field-Oriented Control (FOC) of motors. FIG. 10 is a block diagram illustrating a control system for field-oriented control of motors, according to an embodiment of the present invention. In this embodiment, a Permanent Magnet Synchronous Motor (PMSM) is shown. PMSM motors with Field-Oriented Control (FOC) are used in appliances such as washing machines, air Conditioners, refrigerators and similar applications. PMSM are more efficient than BLDC motors and thus are attractive as the appliances consumer less power. They also have low audible noise and EMI.

The PMSM is an AC synchronous motor whose field excitation is provided by permanent magnets. The stator carries a rotating field and this produces a torque on the permanent magnet rotor. The optimal torque is produced (least energy used) when the stator field is orthogonal to the permanent magnet rotor field and the rotor position is detected via BEMF sensing. PMSM motors are designed to be driven with a sine-wave modulated PWM and their BEMF is also a sine wave (as opposed to trapezoidal for a BLDC motor). Since the BEMF is sinusoidal, it ideally contains no harmonics and this leads to a reduction in audible noise as well as better efficiency.

The basic drive equations require the mapping of a 3-dimensional current space (the current in the stator windings) to a 2-dimensional current space representing the magnetic flux space and then that 2-dimensional space is then translated to another 2-dimensional rotating reference frame which is aligned to the rotor. These two transformations are called, respectively, the Clarke and Park transforms (after their inventors) and result in a mapping of drive current to rotor position which is then used to drive the stator windings when the rotor pole position is 90° out of phase with the respective stator winding. This produces the optimal torque. The stator drive currents are calculated using the inverse Park transform (i.e., current from position).

Computation of the transforms requires multiplication and sine and cosine calculations and require this computation to be performed generally every 50 µseconds. The MIPS requirement varies depending on the source but it is required to be able to do 16×16 multiplications quickly and a number of 11 MIPS has been cited for a 16-bit machine with DSP assist hardware. Higher MIPS numbers are required for a general-purpose CPU and at least 20 MIPS is considered to be the minimum.

As will be apparent to those of skill in the art, the required precision of control required in FOC makes accurate and predictable duty cycle essential in implementing FOC using PWM; the various CDC-SSPWM approaches described in this disclosure are therefore particularly applicable to those applications of FOC where a reduction in EMI is desired.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium;

read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method, comprising:
   driving a load using a pulse-width modulated (PWM) signal; and
   spreading, by a processing device, a spectrum of the PWM signal across a plurality of frequencies while maintaining a substantially constant duty cycle for the load, wherein the spreading comprises varying a clock frequency for the PWM signal according to a spreading profile and synchronizing the variations in the clock frequency with a change in a period of the PWM signal.

2. The method of claim 1, wherein the spreading comprises:
   maintaining a constant clock frequency for the PWM signal; and
   varying a period length of the PWM signal according to a spreading profile.

3. The method of claim 2, wherein varying the period length comprises:
   determining a terminal count value representing the period length; and
   calculating a duty cycle count value corresponding to the substantially constant duty cycle for the load.

4. The method of claim 2, wherein the spreading profile comprises one of a triangle profile, a "Hershey kiss" profile, and a pseudo-random profile.

5. The method of claim 1, wherein synchronizing the variations comprises:
   generating a first clock frequency and a second clock frequency;
   identifying a change in the period of the PWM signal; and
   switching from the first clock frequency to the second clock frequency at the change in the period.

6. The method of claim 1, wherein the spreading comprises:
   varying a clock frequency for the PWM signal according to a first spreading profile;
   synchronizing the variations in the clock frequency with a change in a period of the PWM signal; and
   varying a period length of the PWM signal according to a second spreading profile.

7. The method of claim 1, wherein the load comprises a brushless direct current (BLDC) motor.

8. The method of claim 1, wherein the load comprises a motor using field oriented control (FOC).

9. An apparatus, comprising:
   a pulse-width modulation (PWM) circuit configured to drive a load using a PWM signal; and
   a PWM control circuit, coupled to the PWM circuit, configured to spread a spectrum of the PWM signal across a plurality of frequencies while maintaining a desired duty cycle for the load, the PWM control circuit comprising a selection circuit to vary a clock frequency for the PWM signal according to a spreading profile and synchronize the variations in the clock frequency with a change in a period of the PWM signal.

10. The apparatus of claim 9, wherein the PWM circuit comprises:
    a counter clocked by a clock signal;
    a first digital comparator to compare a value of the counter to a duty cycle count value;
    a second digital comparator to compare the value of the counter to a terminal count value; and
    a flip flop configured to switch an output of the PWM circuit based on outputs of the first and second digital comparators.

11. The apparatus of claim 10, wherein the PWM control circuit comprises:
    a processing device;
    a storage device, coupled to the processing device, to store a plurality of terminal count values, the plurality of terminal count values to vary a period length of the PWM signal according to a spreading profile while the clock signal remains constant.

12. The apparatus of claim 11, the processing device to calculate a plurality of duty cycle count values corresponding to the plurality of terminal count values based on the desired duty cycle.

13. The apparatus of claim 10, further comprising:
    a substantially constant-frequency clock source; and
    a plurality of clock multipliers coupled to the substantially constant-frequency clock source to provide varying clock frequencies,
    wherein the selection circuit to select an output of one of the plurality of clock multipliers to provide as the clock signal.

14. The apparatus of claim 10, further comprising:
    a programmable clock generator, wherein an output of the programmable clock generator is provided as the clock signal, and wherein a change in the output of the programmable clock generator is synchronized with a change in a period of the PWM signal.

15. The apparatus of claim 9, wherein the load comprises a motor.

16. The apparatus of claim 9, wherein the load comprises a brushless direct current (BLDC) motor.

17. The apparatus of claim 9, wherein the load comprises a motor using field oriented control (FOC).

18. A method comprising:
    comparing a value of a counter to a duty cycle count register value, wherein the counter is clocked by a clock signal;

varying a frequency of the clock signal and synchronizing the variations in the clock frequency with a change in a PWM period according to a spreading profile;

if the value of the counter equals the duty cycle count register value, switching an output of a pulse-width modulation (PWM) circuit used to drive a load from a first state to a second state;

comparing the value of the counter to a terminal count register value;

if the value of the counter equals the terminal count value, switching the output of the PWM circuit from the second state to the first state.

19. The method of claim 18 further comprising:
if the value of the counter equals the terminal count value:
resetting the counter to an initial value; and
loading a subsequent duty cycle count value into the duty cycle register and a subsequent terminal count value into the terminal count register.

20. The method of claim 19, wherein the subsequent terminal count value varies a length of the PWM period according to the spreading profile.

21. The method of claim 19, wherein the subsequent duty cycle count value is proportional to the subsequent terminal count value to maintain a substantially constant duty cycle.

22. The method of claim 18, wherein the load comprises a brushless direct current (BLDC) motor.

23. The method of claim 18, wherein the load comprises a motor using field oriented control (FOC).

* * * * *